(12) United States Patent
Wang et al.

(10) Patent No.: US 12,431,337 B2
(45) Date of Patent: Sep. 30, 2025

(54) PLASMA PROCESSING DEVICE AND RETRACTABLE SEALING PART THEREOF

(71) Applicant: ADVANCED MICRO-FABRICATION EQUIPMENT INC. CHINA, Shanghai (CN)

(72) Inventors: Zhihao Wang, Shanghai (CN); Lei Wu, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 351 days.

(21) Appl. No.: 17/825,874

(22) Filed: May 26, 2022

(65) Prior Publication Data

US 2022/0384157 A1 Dec. 1, 2022

(30) Foreign Application Priority Data

Jun. 1, 2021 (CN) .......................... 202110610144.9

(51) Int. Cl.
*H01J 37/32* (2006.01)
(52) U.S. Cl.
CPC .. *H01J 37/32642* (2013.01); *H01J 37/32174* (2013.01); *H01J 37/32568* (2013.01); *H01J 2237/2006* (2013.01)

(58) Field of Classification Search
None
See application file for complete search history.

(56) References Cited

U.S. PATENT DOCUMENTS

| | | | |
|---|---|---|---|
| 6,673,196 B1* | 1/2004 | Oyabu | H01J 37/32743 156/345.31 |
| 2006/0191484 A1* | 8/2006 | Mitrovic | H01J 37/32477 118/729 |
| 2012/0111502 A1* | 5/2012 | Matsuda | C23C 16/4401 156/345.54 |
| 2020/0194275 A1* | 6/2020 | Huang | H01L 21/67069 |

* cited by examiner

*Primary Examiner* — Parviz Hassanzadeh
*Assistant Examiner* — Tiffany Z Nuckols
(74) *Attorney, Agent, or Firm* — Womble Bond Dickinson (US) LLP

(57) ABSTRACT

Disclosed are a plasma processing device and a retractable sealing part thereof. The retractable sealing part is arranged in or near a radio-frequency circuit of the plasma processing device. The retractable sealing part includes a bellows assembly having a first end and a second end. Isolation rings are added to an upper part and a lower part of the bellows assembly to weaken longitudinal radio-frequency coupling. Metal sleeves are added to an inner side and an outer side of the bellows assembly to shield transverse radio-frequency coupling. The present disclosure effectively shields radio-frequency coupling on the basis of maintaining the functions of vacuum isolation and extension and retraction of the retractable sealing part, thereby obtaining the stable radio-frequency circuit and etching rate.

19 Claims, 7 Drawing Sheets

PLASMA PROCESSING DEVICE AND RETRACTABLE SEALING PART THEREOF

CROSS-REFERENCE TO RELATED APPLICATIONS

The present application claims priority to and the benefit of Chinese Patent Application No. 202110610144.9, filed on Jun. 1, 2021, the disclosure of which is hereby incorporated herein by reference in its entirety.

FIELD OF TECHNOLOGY

The present disclosure relates to the field of manufacturing of semiconductor equipment, in particular to a plasma processing device and a retractable sealing part thereof.

BACKGROUND

In the field of semiconductor equipment, stainless steel bellows is used at many positions inside a chamber body, such as: around a support shaft of a support base, between the support shaft of the support base and the chamber body, and between a movable grounding ring and a fixed grounding ring; and the stainless steel bellows at these positions are located in or near a radio-frequency circuit, which will lead to many problems.

Specifically, by taking the bellows arranged between the movable grounding ring and the fixed grounding ring as an example, with the continuous advancement of technology nodes, control requirements of an etching process on key dimensions are further improved, and the nodes of 14 nm and below adopt All-In-One and other advanced manufacturing processes. For the All-In-One manufacturing process, a variable electrode plate gap (Gap) may effectively add a process window and reduce the difficulty of adjustment. Therefore, etching equipment for the All-In-One manufacturing process needs to be equipped with upper and lower electrode plates capable of moving relatively. To realize this function, a retractable bellows structure with a vacuum isolation effect is one of necessary components, and the stainless steel bellows is adopted because of larger extension and retraction stroke and good mechanical strength.

However, the inventors found that there are at least the following problems in the prior art. In a complex radio-frequency environment, the stainless steel bellows have the following disadvantages: 1, under different extension and retraction strokes, the capacitance and inductance between stainless steel foils change, resulting in poorer stability of the impedance; and 2, compared with copper and aluminum materials, stainless steel materials have higher resistivity, and there is a non-negligible thermal energy loss during the passing by a radio-frequency current. Due to the above factors, it was found in a testing process of existing products that when the stainless steel bellows is located in or close to the radio-frequency circuit, uncertain series or parallel resonances are easily generated inside the chamber body, leading to the instability of an etching rate.

The statements herein merely provide background related to the present disclosure and do not necessarily constitute the prior art.

SUMMARY

An objective of the present disclosure is to provide a plasma processing device and a retractable sealing part thereof. The present disclosure effectively shields radio-frequency coupling on the basis of maintaining the functions of vacuum isolation and extension and retraction of the retractable sealing part, thereby obtaining the stable radio-frequency circuit and etching rate.

To achieve the objective, the present disclosure provides a retractable sealing part, arranged in or near a radio-frequency circuit of a plasma processing device, and including:

a bellows assembly, having a first end and a second end; and a sleeve assembly, including a first sleeve and a second sleeve, wherein the first sleeve is arranged close to the first end of the bellows assembly, and the second sleeve is arranged close to the second end of the bellows assembly; free ends of the first sleeve and the second sleeve are overlapped with each other to form a radio-frequency shielding space when the first sleeve and the second sleeve slide relatively; the bellows assembly is located in the radio-frequency shielding space; and the sleeve assembly is a conductor. The sleeve assembly shields transverse radio-frequency coupling to obtain the stable radio-frequency circuit and etching rate.

The retractable sealing part further includes a flange assembly, wherein the flange assembly includes a first flange and a second flange, the first flange is connected with the first end of the bellows assembly, and the second flange is connected with the second end of the bellows assembly; and a non-free end of the first sleeve is detachably arranged at the first end of the bellows assembly by the first flange, and a non-free end of the second sleeve is detachably arranged at the second end of the bellows assembly by the second flange.

At least one sealing ring is arranged on a side, away from the bellows assembly, of the first flange, and at least one sealing ring is arranged on a side, away from the bellows assembly, of the second flange, so as to isolate vacuum.

The bellows assembly is a stainless steel foil.

An isolation ring is arranged on a side, away from the bellows assembly, of the first flange, and an isolation ring is also arranged on a side, away from the bellows assembly, of the second flange, to weaken longitudinal radio-frequency coupling, so as to obtain the stable radio-frequency circuit and etching rate.

The retractable sealing part further includes fasteners, configured to fix the first flange, the second flange and/or the isolation rings.

On one hand, the isolation ring is made of a metal material.

On the other hand, the isolation ring is made of an insulation material.

At least one sealing ring is arranged between the isolation ring and the first flange, and at least one sealing ring is arranged between the isolation ring and the second flange, so as to isolate vacuum.

The sleeve assembly is arranged on two sides of the bellows assembly, or a side, close to the radio-frequency circuit, of the bellows assembly.

The first sleeve is arranged away from an outer side of the bellows assembly or close to an inner side of the bellows assembly, and correspondingly, the second sleeve is arranged close to the inner side of the bellows assembly or away from the outer side of the bellows assembly; and the first sleeve and the second sleeve are always maintained to be partially overlapped in a vertical direction.

The first sleeve and/or the second sleeve is of an integral or separate structure.

The first sleeve and the second sleeve are made of surface-treated metal materials.

An insulating buffer layer is arranged between the first sleeve and the second sleeve, contacts the first sleeve and the second sleeve respectively, and ensures the first sleeve and the second sleeve not to contact, so as to avoid instable local contact and the generation of frictional particulate matter.

The insulating buffer layer is made of an insulation material.

The second sleeve is provided with a clamping groove, configured to accommodate the insulating buffer layer.

The insulating buffer layer is adhered to the first sleeve or the second sleeve.

The present disclosure further provides a plasma processing device, including:

a process chamber;

an upper electrode arranged in a chamber body and a lower electrode arranged opposite to the upper electrode, wherein relative positions of the upper electrode and the lower electrode are adjustable, so that a distance between the upper electrode and the lower electrode is adjustable;

at least one radio-frequency power supply connected to the upper electrode or the lower electrode; and a retractable sealing part, arranged in or near the radio-frequency circuit between the upper electrode and the lower electrode, and extending and retracting with the change of the relative positions of the upper electrode and the lower electrode.

The lower electrode is fixed to an RF rod and located on an opening of a bottom wall of the process chamber, and a driving device fixed to a lower end of the RF rod is configured to drive the RF rod to move axially, so as to adjust the position of the lower electrode.

An electrostatic chuck is arranged on the lower electrode and configured to support and clamp a wafer.

In the retractable sealing part provided by the present disclosure, the isolation rings are added to the upper part and the lower part of the bellows assembly to weaken the longitudinal radio-frequency coupling, and the metal sleeves are added to the inner side and the outer side of the bellows assembly to shield the transverse radio-frequency coupling, so as to obtain the stable radio-frequency circuit; and the etching rate has better stability and repeatability. Compared with a traditional bellows structure, the present disclosure is more suitable for use in a radio-frequency circuit area.

DETAILED DESCRIPTION OF THE EMBODIMENTS

The more preferred embodiments of the present disclosure are described in detail below with reference to FIGS. 1-8.

Figure 1:
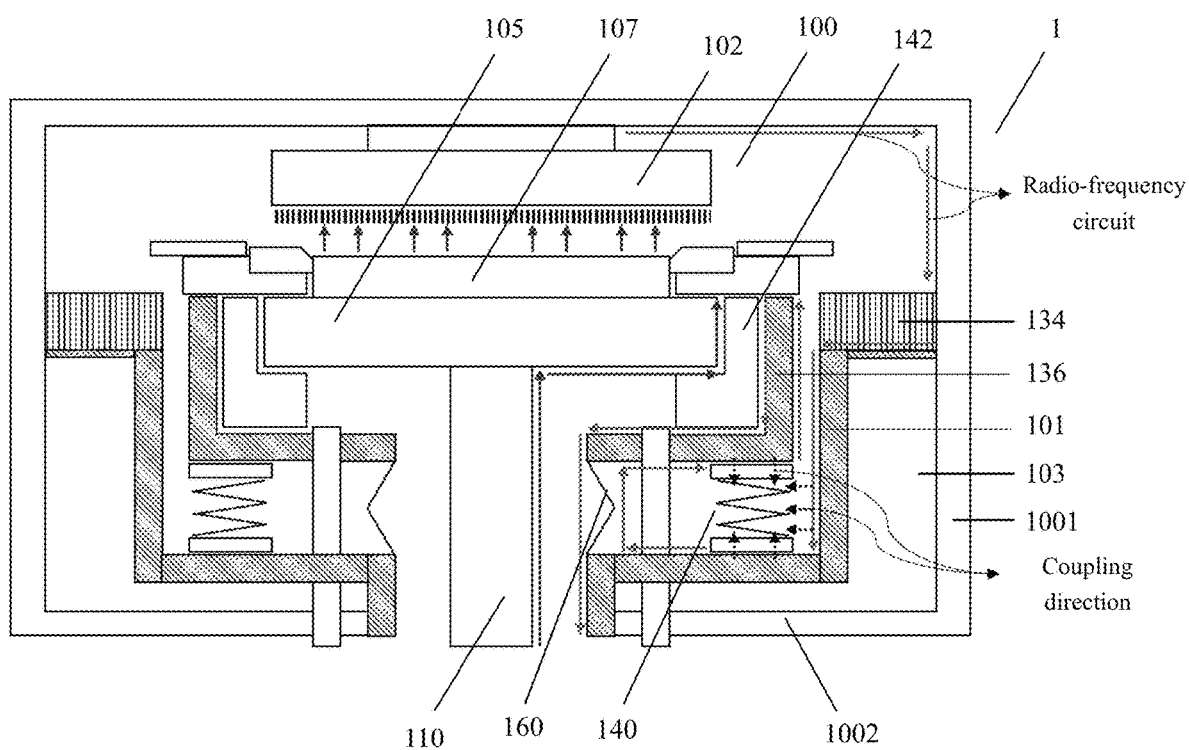
FIG. 1 is a schematic cross-sectional structural diagram of a plasma processing device provided in an embodiment of the present disclosure.

As shown in FIG. 1, in one embodiment of the present disclosure, a plasma processing device 1 is provided, the plasma processing device 1 has a process chamber, and the process chamber is a closed space defined by a chamber body 100 and other necessary components, so that a wafer may be etched in a vacuum environment of the process chamber. An upper electrode 102 and a lower electrode 105 arranged opposite to the upper electrode 102 are arranged in the chamber body 100; the lower electrode 105 is arranged in a base, which is configured to support the wafer to be processed and is arranged on an RF rod 110; a lower end of the RF rod 110 is fixed to a driving device (not shown in the figure); and the driving device is configured to drive the RF rod 110 and the base to move along its axial direction. Usually, a gas spray head is fixed to an upper side in the process chamber as the upper electrode 102; a gas inlet (not shown in the figure) connected with the gas spray head is formed in an end surface outside the process chamber; a gas hole (not shown in the figure) is formed in the gas spray head located in the process chamber; process gas enters the gas spray head through the gas inlet, and is delivered into the process chamber through the gas hole; a reaction area is formed between the upper electrode 102 and the lower electrode 105; and at least one radio-frequency power supply is applied to one of the upper electrode 102 and the lower electrode 105 through a radio-frequency adapter, and a radio-frequency electric field is generated between the upper electrode 102 and the lower electrode 105 to dissociate the process gas into plasma, thereby processing the wafer. As an optional embodiment, the lower electrode 105 is connected with an output terminal of the radio-frequency adapter by the RF rod 110, and the radio-frequency adapter is connected with the radio-frequency power supply (not shown in the figure), so as to provide radio-frequency power to the lower electrode 105. An electrostatic chuck 107 is arranged on the base and configured to adsorb the wafer.

In some embodiments, the lower electrode 105 may be connected with one or more radio-frequency adapters, for example, there may be two radio-frequency adapters. In the embodiment where multiple radio-frequency adapters are connected, each of the radio-frequency adapters may provide a radio-frequency and power differing from those of other radio-frequency adapters, so as to meet the requirements of different processing technologies. In these embodiments, the upper electrode 102 may be grounded. In some other embodiments, the lower electrode 105 may be connected with one radio-frequency adapter, the upper electrode 102 may be connected with the other adapter, and the two radio-frequency adapters may provide different radio frequencies and power.

In this embodiment, the lower electrode 105 is connected with the radio-frequency power supply by the radio-frequency adapter to provide the radio-frequency power; the upper electrode 102 and the chamber body 100 may be grounded; the chamber body 100 or some other accessories electrically connected with the chamber body may serve as a return path of the radio-frequency power; specifically, as shown by a solid line in FIG. 1, the radio-frequency power is output from the output terminal of the radio-frequency adapter, passes through the RF rod 110 and enters the lower electrode 105, and then a radio-frequency current flows into the upper electrode 102 through plasmas between the upper and lower electrodes and returns to a circuit terminal of the radio-frequency adapter through the radio-frequency circuit in the chamber body 100; and according to different chamber body structures and design requirements, the return path may have different settings.

The radio-frequency adapter is connected with the radio-frequency power supply and configured to output required radio-frequency power; the radio-frequency adapter has the output terminal and the circuit terminal; and the output terminal is configured to output the radio-frequency power, and the circuit terminal is configured to receive returned radio-frequency power. A radio-frequency filter is connected with the radio-frequency adapter and configured to filter an interference frequency signal.

The process chamber of the plasma processing device is the closed space defined by the chamber body 100 and other necessary components, so that the wafer may be etched in the vacuum environment of the process chamber. In this embodiment, the upper electrode 102 is arranged at the top of the chamber body 100; the upper electrode 102 may be arranged inside the chamber body 100; the top of the chamber body 100 is sealed by other components, such as an upper cover plate and other structures; the upper electrode 102 may also be embedded in the top of the chamber body 100; and herein, the arrangement of the upper electrode 102 is merely an example, and the present application does not limit the arrangement of the upper electrode 102 and the sealing of the top of the chamber body 100.

In this embodiment, the chamber body 100 includes a side wall 1001 and a bottom wall 1002, and the lower electrode 105 is located above an opening of the bottom wall 1002, so that the RF rod 110 may move up and down at the opening.

In this embodiment, an insulation ring 142 is arranged around the lower electrode 105, the insulation ring 142 is fixed to the lower electrode 105, and a movable grounding ring 136 is fixedly arranged on an outer side of the insulation ring 142. The insulation ring 142 is made of insulation materials, such as ceramic materials, and is configured to electrically isolate the lower electrode 105 from the movable grounding ring 136. The movable grounding ring 136 is made of conductive materials, and the movable grounding ring 136 serves as a part of the radio-frequency return path. A fixed grounding ring 101 is further arranged in the chamber body 100; the fixed grounding ring 101, also a part of the radio-frequency return path, is made of conductive materials and located outside the movable grounding ring 136; a gap is formed between the fixed grounding ring and 136; and the movable grounding ring 136 is configured to shield the radio-frequency interference between the lower electrode 105 and the fixed grounding ring 101. A chamber 103 is formed between the fixed grounding ring 101 and the chamber body 100; the chamber 103 is configured to form an exhaust chamber; a confinement ring 134 is arranged on the chamber 103; the confinement ring 134 forms the exhaust chamber with the fixed grounding ring 101 and the chamber body 100; and meanwhile, the confinement ring 134 includes a conductive component. The fixed grounding ring 101 is a conductive isolation wall, which may serve as the radio-frequency return path on the one hand, and transversely isolate a space of the exhaust chamber on the other hand. The confinement ring 134 is of a ventilation structure, so that excess plasmas in the chamber body are extinguished and exhaust gas enters the exhaust chamber. Usually, the exhaust chamber is further provided with a gas pump, by which the exhaust gas in the chamber is discharged. The radio-frequency current passes through the confinement ring 134 from the side wall 1001 of the chamber body and then enters the fixed grounding ring 101. In this way, by using the necessary components such as the exhaust chamber 103 and the confinement ring 134 in the chamber, a return path of the radio-frequency current is realized. The return path of the radio-frequency current may be effectively shortened.

In this embodiment, the retractable sealing part 140 is arranged between the movable grounding ring 136 and the fixed grounding ring 101 and configured to seal an upper surface of the lower electrode 105 in an accommodating space where the chamber body 100 is located. As shown in FIG. 1, the closed space at a lower part of the chamber body 100 is defined by a side wall of the fixed grounding ring 101, an inner wall of the retractable sealing part 140 and a side wall of the movable grounding ring 136, the upper surface of the lower electrode 105 is arranged inside the chamber body 100, a lower surface of the lower electrode 105 and the RF rod 110 are arranged outside a closed environment of the chamber body 100, and the vacuum environment will be provided in the chamber body 100 to perform an etching process. The retractable sealing part 140 extends and retracts up and down with the axial movement of the RF rod 110, that is to say, the retractable sealing part 140 and the RF rod 110 have a same moving direction. Herein, the upper surface of the lower electrode 105 is a surface facing the upper electrode 102. In this way, when the RF rod 110 is driven to move up and down, the retractable sealing part 140 will extend and retract together with the lower electrode 105, and meanwhile, the lower electrode 105 is sealed in the chamber body 100 by the retractable sealing part 140. It may be understood that the retractable sealing part 140 may be directly or indirectly fixed to the lower electrode 105. When other components are further arranged in the chamber body 100, the retractable sealing part 140 may cooperate with the other components. The retractable sealing part 140 is generally arranged in or near the radio-frequency circuit of the plasma processing device, so as to seal the bottom of the chamber body. The surface, facing the upper electrode 102, of the lower electrode 105 is located in the closed chamber.

The chamber body 100 is further provided with a conductive strip 160; the conductive strip 160 is connected between the movable grounding ring 136 and the fixed grounding ring 101; the length of the conductive strip 160 is adapted to the extension and retraction quantity of the retractable sealing part 140; the conductive strip 160 may be made of flexible conductive materials, such as metallic copper; the length of the conductive strip 160 has a certain allowance; and when the retractable sealing part 140 extends and retracts up and down, it may still be ensured that both the movable grounding ring 136 and the fixed grounding ring 101 maintain a good electrical connection state, thereby forming the complete radio-frequency circuit.

The complete radio-frequency circuit is shown by a solid arrow in FIG. 1. The radio-frequency current flows into the upper electrode 105 through the RF rod 110, flows into the upper electrode 102 through the plasmas between the upper and lower electrodes, flows to an upper surface of a middle grounding ring below the confinement ring 134 through an inner side of the chamber body 100, flows to an outer side of the conductive strip 160 through an inner side of the fixed grounding ring 101, flows to an outer side of the movable grounding ring 136, flows back to an inner side of the movable grounding ring 136, and finally flows to the fixed grounding ring 101 through an inner side of the conductive strip 160, so as to return to the circuit terminal of the radio-frequency adapter to form the complete radio-frequency circuit.

Since a main body of the retractable sealing part 140 is a stainless steel bellows, when the stainless steel bellows is located in or close to the radio-frequency circuit, an uncertain series or parallel resonance is easily generated inside the chamber body. As shown in FIG. 1, an inner surface of the fixed grounding ring 101 and inner and outer surfaces of the movable grounding ring 136 are all necessary routes for the radio-frequency circuit. The stainless steel bellows is configured herein to connect the fixed grounding ring and the movable grounding ring and seal a vacuum. There is a millimeter-level distance between two ends of the stainless steel bellows and the radio-frequency circuit. Capacitors are small, but there is still a risk of radio-frequency coupling (especially high frequencies), resulting in a certain energy loss. As shown by a dotted arrow in FIG. 1, longitudinal radio-frequency coupling will occur from two upper and lower ends of the stainless steel bellows, and transverse radio-frequency coupling will also occur from side surfaces of the stainless steel bellows. The radio-frequency coupling will lead to the instability of an etching rate.

To solve the problem of shielding of radio-frequency coupling of the retractable sealing part exposed in a radio-frequency area, the present disclosure provides a retractable sealing part, which is generally arranged in or near the radio-frequency circuit of the plasma processing device. As shown in FIG. 1, in one embodiment, two ends of the retractable sealing part 140 are respectively connected with the fixed grounding ring 101 and the movable grounding ring 136.

Figure 2:
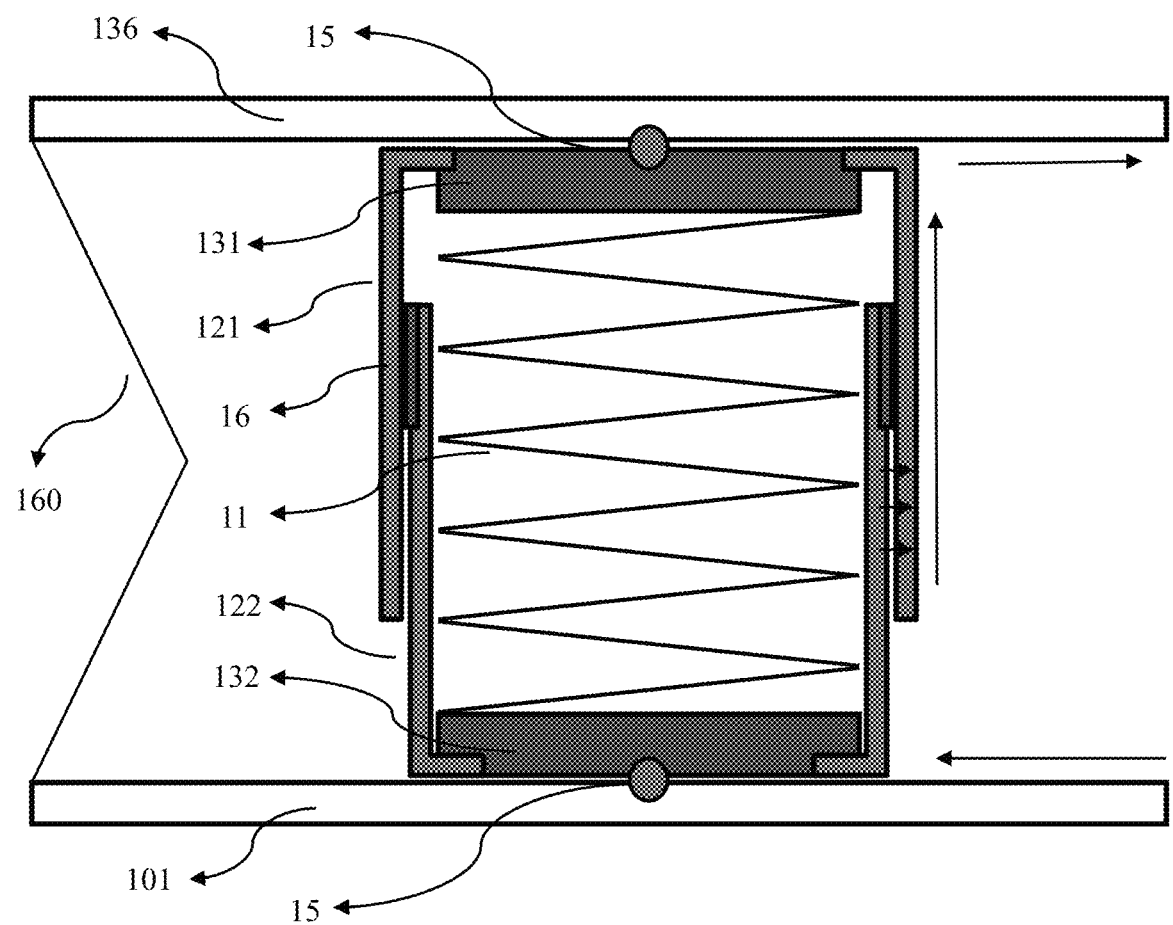
FIG. 2 is a schematic cross-sectional structural diagram of a retractable sealing part provided in an embodiment of the present disclosure.

As shown in FIG. 2, the retractable sealing part 140 includes a bellows assembly 11 having a first end and a second end; the whole bellows assembly 11 is annularly arranged around the RF rod 110; the bellows assembly 11 is a stainless steel foil; the first end is directly connected with the movable grounding ring 136 by a first flange 131; and the second end is directly connected with the fixed grounding ring 101 by a second flange 132. The first flange 131 and the second flange 132 are made of surface-treated metal materials, including but not limited to copper, aluminum, nickel, etc. In this embodiment, a sealing ring 15 is arranged between the first flange 131 and the movable grounding ring 136, and a sealing ring 15 is arranged between the second flange 132 and the fixed grounding ring 101, so as to achieve sealing and vacuum isolation.

To shield the radio-frequency coupling flowing to the bellows assembly 11, a sleeve assembly is arranged on each of a side (i.e. an inner side), close to the conductive strip 160 and a side (i.e. an outer side) close to the side wall 1001, of the bellows assembly 11; the sleeve assembly includes a first sleeve 121 and a second sleeve 122; the first sleeve 121 is arranged close to the first end of the bellows assembly 11; the second sleeve 122 is arranged close to the second end of the bellows assembly 11; the first sleeve 121 is a first shielding body; the second sleeve 122 is a second shielding body; and the first and second shielding bodies form a shielding space. A non-free end of the first sleeve 121 is detachably arranged at the first end of the bellows assembly 11 by the first flange 131; the first sleeve 121 may move up and down with the first flange 131; a non-free end of the second sleeve 122 is detachably arranged at the second end of the bellows assembly 11 by the second flange 132; and the second sleeve 122 may move up and down with the second flange 132. Free ends of the first sleeve 121 and the second sleeve 122 are always maintained to be partially overlapped with each other in a vertical direction during the extension and retraction of the bellows assembly 11, so as to form the radio-frequency shielding space when the first sleeve 121 and the second sleeve 122 slide relatively; and the bellows assembly 11 is always completely located in the radio-frequency shielding space. The overlapping positions of the first sleeve 121 and the second sleeve 122 may be interchanged; the first sleeve 121 may be arranged close to the inner side of the bellows assembly 11, and the second sleeve 122 may be arranged away from the outer side of the bellows assembly 11; or vice versa, the first sleeve 121 is arranged on the outer side of the bellows assembly, and the second sleeve 122 is arranged on the inner side of the bellows assembly. In this embodiment, the first sleeve 121 and the second sleeve 122 are made of surface-treated metal materials, including but not limited to copper, aluminum, nickel, etc. The radio-frequency circuit of this embodiment is specifically as follows: the radio-frequency current flows from the fixed grounding ring 101 through a side, close to the side wall 1001, of the sleeve assembly into the movable grounding ring 136 (the radio-frequency current is as shown by a black arrow in FIG. 2); and since the sleeve assembly is a metal conductor and the bellows assembly 11 is located in the radio-frequency shielding space, the radio-frequency current may be prevented from being coupled to the bellows assembly 11, so as to obtain the stable radio-frequency circuit and etching rate.

Figure 3:
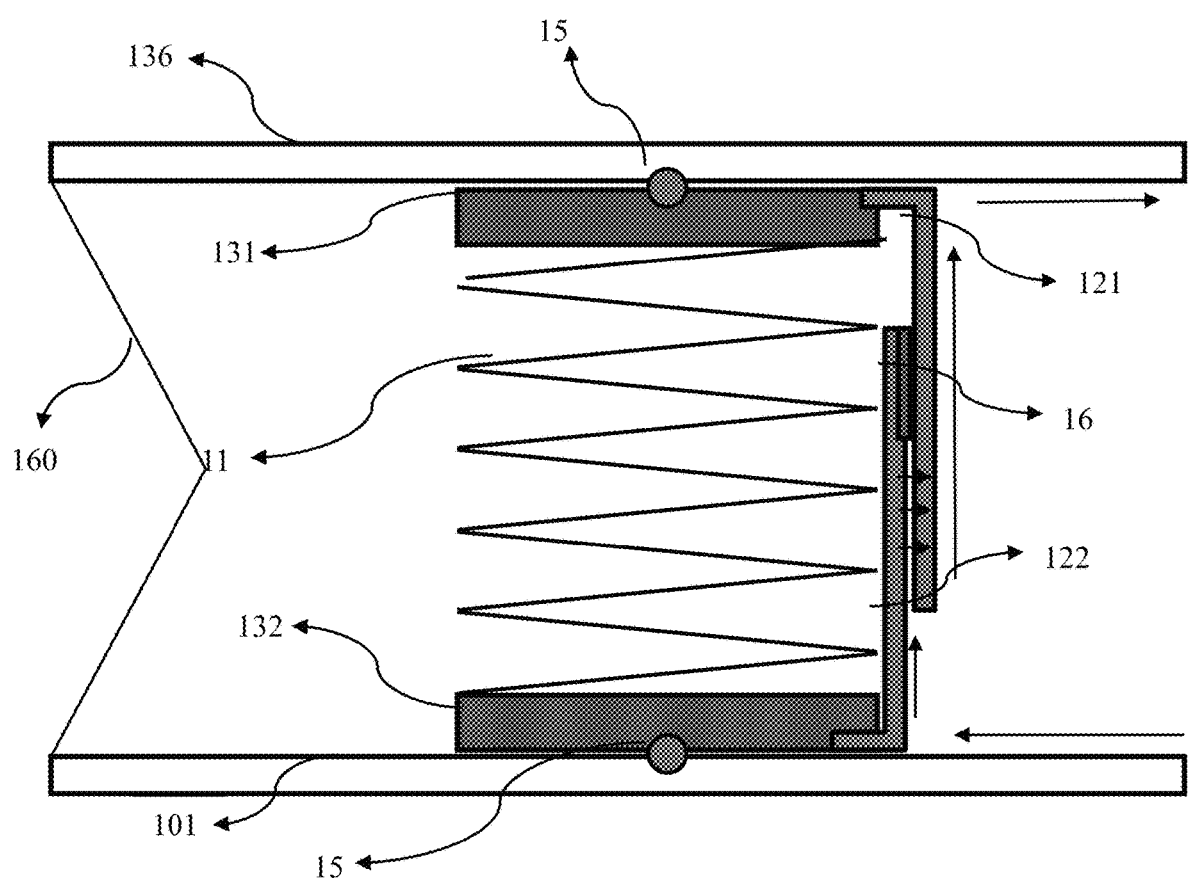
FIG. 3 is a schematic cross-sectional structural diagram of a retractable sealing part provided in another embodiment of the present disclosure.

For the specific embodiment of the sleeve assembly, FIG. 3 shows an embodiment in which the sleeve assembly is arranged only on a side close to the side wall 1001. In this embodiment, the first sleeve 121 includes an annular shape extending in a longitudinal direction, and the second sleeve 122 also includes an annular shape extending in a longitudinal direction; as an optional way to fix the sleeve assembly, the non-free end of the first sleeve 121 is provided with a transverse extension part, and the non-free end of the second sleeve 122 is also provided with a transverse extension part; an annular groove is formed in a side, close to the side wall 1001, of each of the first flange and the second flange, and the annular groove is configured to clamp the transverse extension part of each of the first sleeve 121 and the second sleeve 122; and the flanges are fixed to the grounding rings by fasteners, and grooves between the grounding rings and the flanges clamp the sleeves to form a fixed connection, wherein the fasteners may be selected from screws. The radio-frequency circuit of this embodiment is specifically as follows: the radio-frequency current flows from the fixed grounding ring 101 through a side, close to the side wall 1001, of the sleeve assembly into the movable grounding ring 136 (the radio-frequency current is as shown by a black arrow in FIG. 3); and since the sleeve assembly is a conductor and the bellows assembly 11 is located in the radio-frequency shielding space, the radio-frequency current may be prevented from being coupled to the bellows assembly 11, so as to obtain the stable radio-frequency circuit and etching rate.

Figure 4:
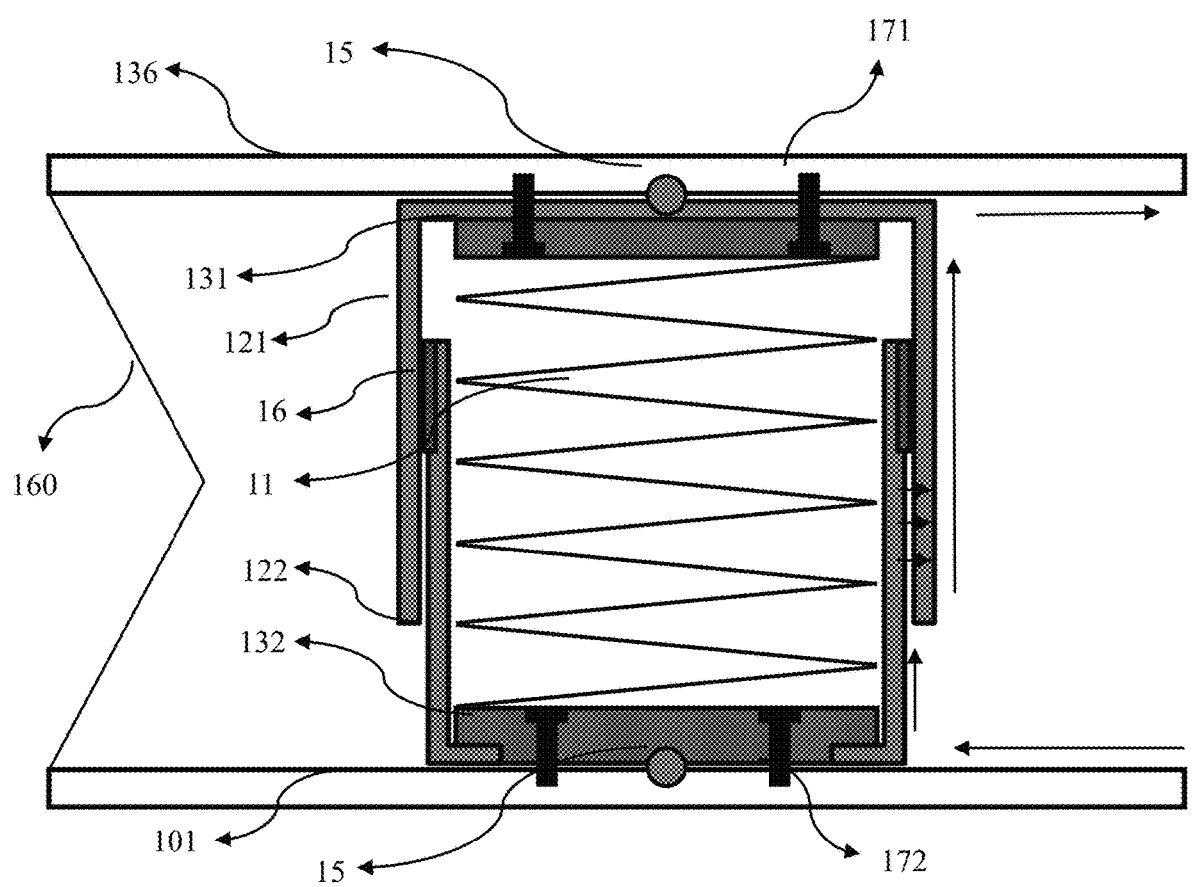
FIG. 4 is a schematic cross-sectional structural diagram of a retractable sealing part provided in a third embodiment of the present disclosure.

For the specific embodiment of the sleeve assembly, FIG. 4 shows an embodiment in which the sleeve assembly is arranged on each of a side (i.e. an inner side), close to the conductive strip 160 and a side (i.e. an outer side) close to the side wall 1001, of the bellows assembly 11. In this embodiment, the first sleeve 121 includes an integral "U"-shaped body, and the second sleeve 122 includes two independent annular shapes extending longitudinally, which are arranged concentrically. Of course, the first sleeve 121 and the second sleeve 122 may be interchanged in shape. Optionally, each of the first sleeve 121 and the second sleeve 122 includes the "U"-shaped body or the two independent annular shapes. For fixation when each of the sleeves includes the "U"-shaped body, optionally, the flanges and the sleeves are fixed to the grounding rings by the fasteners 171. In this embodiment, the first flange 131 is fixed to the movable grounding ring 136 by using the fasteners 171; the second flange 132 is fixed to the fixed grounding ring 101 by using the fasteners 172; and the fasteners are also made of surface-treated metal materials, including but not limited to copper, aluminum, nickel, etc. For fixation when each of the sleeves includes the two independent annular shapes, the above-mentioned way of cooperating the groove with the transverse extension part may also be adopted, which will not be described in detail herein. The radio-frequency circuit of this embodiment is specifically as follows: the radio-frequency current flows from the fixed grounding ring 101 through a side, close to the side wall 1001, of the sleeve assembly into the movable grounding ring 136 (the radio-frequency current is as shown by a black arrow in FIG. 4); and since the sleeve assembly is a conductor and the bellows assembly 11 is located in the radio-frequency shielding space, the radio-frequency current may be prevented from being coupled to the bellows assembly 11, so as to obtain the stable radio-frequency circuit and etching rate.

Figure 5:
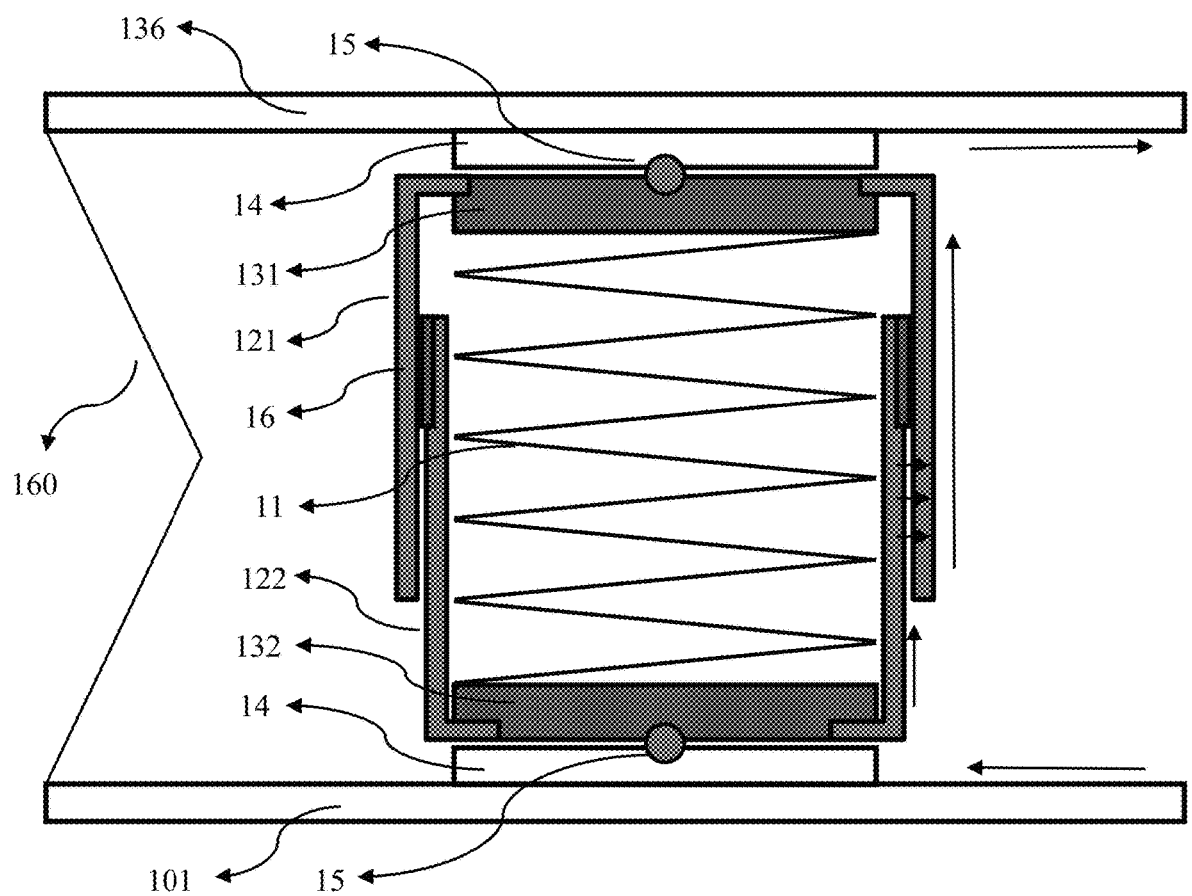
FIG. 5 is a schematic cross-sectional structural diagram of a retractable sealing part provided in a fourth embodiment of the present disclosure.

As shown in FIG. 5, another embodiment is shown, an isolation ring 14 with a certain thickness is arranged between the first flange 131 and the movable grounding ring 136, and an isolation ring 14 is also arranged between the second flange 132 and the fixed grounding ring 101. In this embodiment, the isolation ring 14 is also made of surface-treated metal materials, including but not limited to copper, aluminum, nickel, etc. The radio-frequency circuit of this embodiment is specifically as follows: the radio-frequency current flows from the fixed grounding ring 101 through a side, close to the side wall 1001, of the sleeve assembly and the corresponding isolation ring 14 into the movable grounding ring 136 (the radio-frequency current is as shown by a black arrow in FIG. 5); and since the sleeve assembly and the isolation ring 14 is a conductor and the bellows assembly 11 is located in the radio-frequency shielding space, the radio-frequency current may be prevented from being coupled to the bellows assembly 11, so as to obtain the stable radio-frequency circuit and etching rate. In this embodiment, sealing rings 15 are arranged between the isolation ring 14 and the first flange 131 and between the isolation ring and the second flange 132, so as to achieve vacuum isolation. Isolation rings are added to an upper part and a lower part of the bellows assembly to weaken longitudinal radio-frequency coupling, so as to obtain the stable radio-frequency circuit and etching rate.

Figure 6:
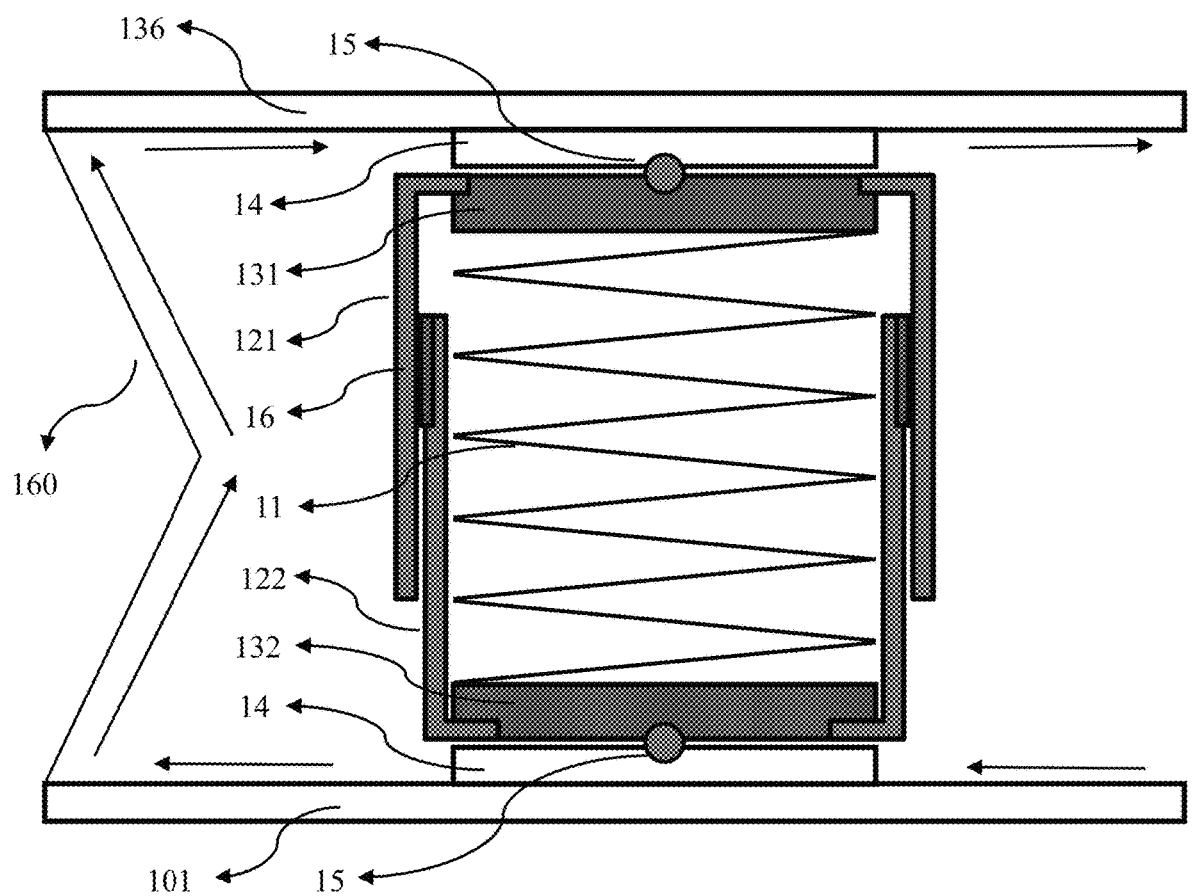
FIG. 6 is a schematic cross-sectional structural diagram of a retractable sealing part provided in a fifth embodiment of the present disclosure.

FIG. 6 shows another optional embodiment. In this embodiment, the isolation ring 14 is made of an insulation material, which may be a ceramic or a material with a lower dielectric constant, including but not limited to aluminum oxide, aluminum nitride, quartz, polyetherimide, Peek, etc. The radio-frequency circuit of this embodiment is specifically as follows: the radio-frequency current flows from the fixed grounding ring 101 into the movable grounding ring 136 through the conductive strip 160 (the radio-frequency current is as shown by a black arrow in FIG. 6); and since the isolation ring 14 is an insulator and the bellows assembly 11 is located in the radio-frequency shielding space, the radio-frequency current may be prevented from being coupled to the bellows assembly 11, so as to obtain the stable radio-frequency circuit and etching rate. The isolation rings are added to the upper part and the lower part of the bellows assembly to weaken the longitudinal radio-frequency coupling, so as to obtain the stable radio-frequency circuit and etching rate.

For the free ends of the first sleeve and the second sleeve, optionally, the first sleeve 121 and the second sleeve 122 may be arranged in close contact, but this may result in uneven circumferential distribution of radio frequency due to inconsistent tightness of contact between them, and a frequent frictional movement between the first sleeve 121 and the second sleeve 122 will also generate particulate matter, which will adversely affect the manufacturing process. In an optional embodiment, an insulating buffer layer 16 is arranged between the first sleeve 121 and the second sleeve 122; the insulating buffer layer 16 contacts the first sleeve 121 and the second sleeve 122 respectively; the thickness of the insulating buffer layer 16 may not be too small, and should ensure the first sleeve 121 and the second sleeve 122 not to contact; and the thickness of the insulating buffer layer may not be too large, and should ensure that a gap between the first sleeve 121 and the second sleeve 122 is capable of conducting the radio-frequency current. The insulating buffer layer 16 may be directly adhered to the first sleeve 121 or the second sleeve 122, or, the first sleeve 121 or the second sleeve 122 is provided with a clamping groove, configured to accommodate the insulating buffer layer 16. The insulating buffer layer 16 is made of an insulation material, including but not limited to aluminum oxide, aluminum nitride, quartz, polyetherimide, polyetheretherketone (Peek), etc. The first sleeve 121 and the second sleeve 122 are isolated by the insulating buffer layer 16 to avoid instable local contact and the generation of frictional particulate matter.

In the retractable sealing part provided by the present disclosure, through the sealing rings and a double-layer sleeve structure, the present disclosure also has the functions of isolating the vacuum and being retractable. Furthermore, the isolation rings are added to the upper part and the lower part of the bellows assembly to weaken the longitudinal radio-frequency coupling, and the metal sleeves are added to the inner side and the outer side of the bellows assembly to shield the transverse radio-frequency coupling, so as to obtain the stable radio-frequency circuit and etching rate. Compared with a traditional bellows structure, the present disclosure is more suitable for use in a radio-frequency circuit area. The use of different isolation ring materials, the use of different metal sleeve materials, and the use of a similar double-layer sleeve structure for local radio-frequency shielding all belong to modifications of the embodiments of the present disclosure.

SD-RIE 9900 experiments are carried out to verify the effectiveness of the retractable sealing part provided by the present disclosure on shielding of the radio-frequency coupling.

Figure 7:
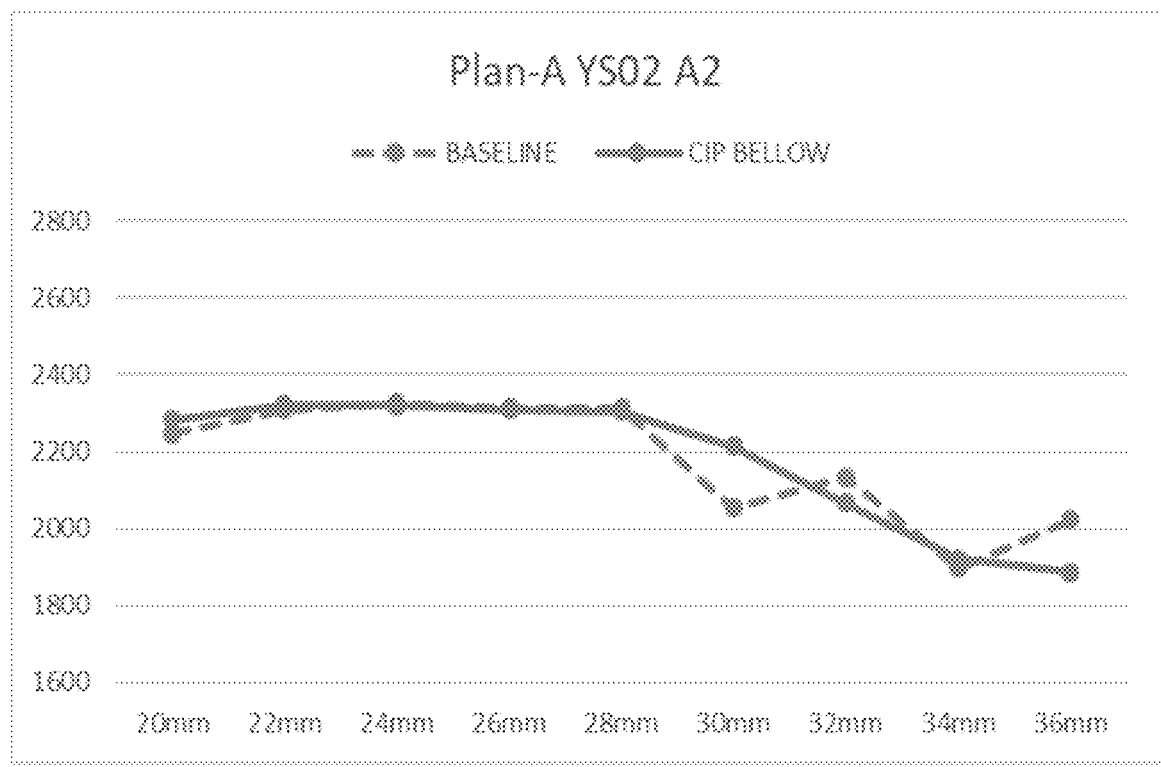
FIG. 7 and FIG. 8 are test data graphs of an etching rate.
Figure 8:
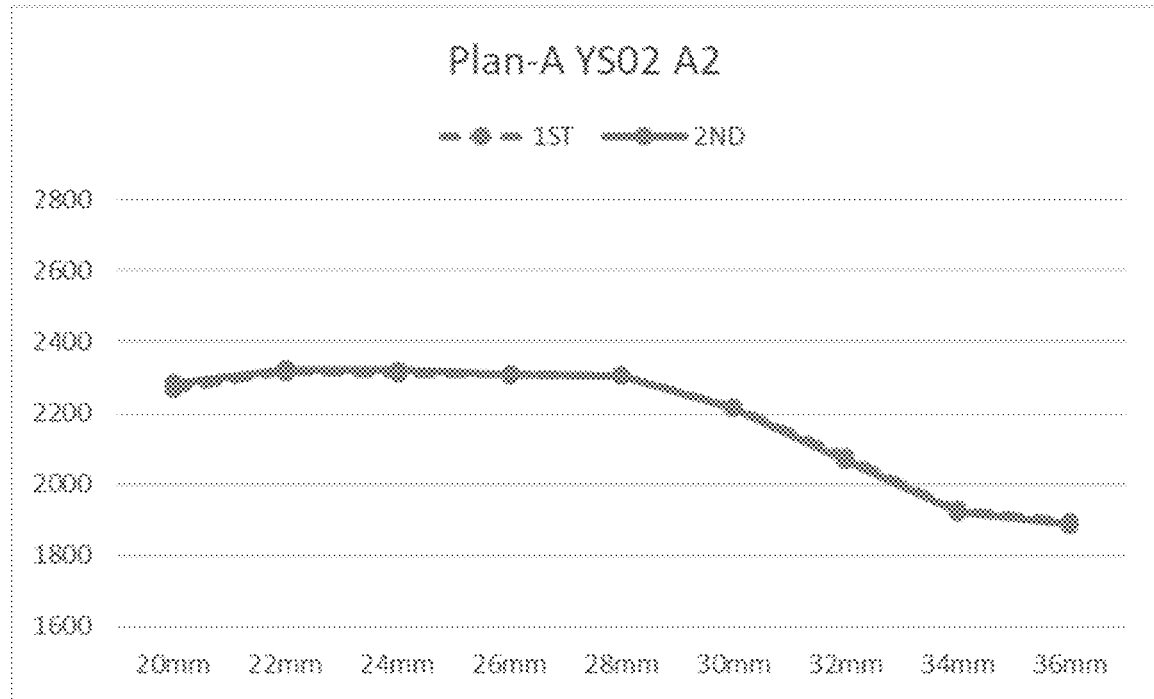

As shown in FIG. 7, an X axis is a distance between the upper and lower electrodes, a Y axis is the etching rate, the solid line is test data obtained by using the retractable sealing part provided by the present disclosure, and a dotted line is test data obtained by not using the retractable sealing part provided by the present disclosure. It may be seen from FIG. 7 that by using the retractable sealing part provided by the present disclosure, the etching rate has better stability (no longer jumps up and down). As shown in FIG. 8, an X axis is a distance between the upper and lower electrodes, a Y axis is the etching rate, a dotted line is test data obtained by performing a first process by using the retractable sealing part provided by the present disclosure, and the solid line is test data obtained by performing a second process by using the retractable sealing part provided by the present disclosure. It may be seen from FIG. 8 that by using the retractable sealing part provided by the present disclosure, the etching rate has good repeatability (double lines coincide).

Experimental data shows that the retractable sealing part provided by the present disclosure may effectively prevent the radio-frequency coupling and reduce the thermal energy loss caused by the stainless steel foil. Etching rate data of the chamber body using the retractable sealing part has better stability and repeatability.

It should be noted that in the embodiments of the present disclosure, the terms "center", "longitudinal", "transverse", "length", "width", "thickness", "upper", "lower", "front", "back", "left", "right", "vertical", "horizontal", "top", "bottom", "inside", "outside", "clockwise", "counterclockwise", "axial", "radial", "circumferential" and other indicated orientations or positional relationships are based on the orientations or positional relationships shown in the accompanying drawings, which are merely for the convenience of describing the embodiments, rather than indicating or implying that the referred devices or elements must have the particular orientations and are constructed and operated in the particular orientations. Therefore, it should not be understood to limit the present disclosure. Furthermore, the terms "first", "second", and "third" are merely used for descriptive purposes and should not be understood to indicate or imply relative importance.

In the present disclosure, unless otherwise expressly specified and limited, the terms such as "installation", "connected", "connection", "fixation" and other terms should be understood in a broad sense. For example, it may be a fixed connection, a detachable connection, or integrated; it may be a mechanical connection or an electrical connection; and it may be directly connected, indirectly connected through an intermediate medium, internal communication between two components or an interactive relationship between the two components. For those of ordinary skill in the art, specific meanings of the above terms in the present disclosure may be understood according to specific situations.

While the content of the present disclosure has been described in detail by way of the above preferred embodiments, it should be appreciated that the above description should not be recognized to limit the present disclosure. Various modifications and replacements to the present disclosure will be apparent to those skilled in the art upon reading the foregoing. Accordingly, the scope of protection of the present disclosure should be defined by the appended claims.

What is claimed is:

1. A plasma processing device, comprising:
   a process chamber;
   an upper electrode arranged in the process chamber and a lower electrode arranged opposite to the upper electrode, wherein relative positions of the upper electrode and the lower electrode are adjustable, so that a distance between the upper electrode and the lower electrode is adjustable;
   at least one radio-frequency power supply connected to the upper electrode or the lower electrode; and
   a retractable sealing part, arranged in or near a radio-frequency circuit between the upper electrode and the lower electrode, and extending and retracting with a change of the relative positions of the upper electrode and the lower electrode;
   wherein the retractable sealing part comprises:
   a bellows assembly, having a first end and a second end;
   a sleeve assembly, comprising a first sleeve and a second sleeve, wherein the first sleeve is arranged close to the first end of the bellows assembly, and the second sleeve is arranged close to the second end of the bellows assembly; free ends of the first sleeve and the second sleeve are overlapped with each other to form a radio-frequency shielding space when the first sleeve and the second sleeve slide relatively; wherein the bellows assembly is located in the radio-frequency shielding space, and the sleeve assembly is a conductor; and
   further comprising an insulating buffer layer arranged between the first sleeve and the second sleeve, the insulating buffer layer contacts the first sleeve and the second sleeve, respectively.

2. The plasma processing device according to claim 1, wherein a non-free end of the first sleeve is detachably arranged at the first end of the bellows assembly by a first flange, and a non-free end of the second sleeve is detachably arranged at the second end of the bellows assembly by a second flange.

3. The plasma processing device according to claim 2, wherein at least one sealing ring is arranged on a side, away from the bellows assembly, of the first flange, and at least one sealing ring is arranged on a side, away from the bellows assembly, of the second flange.

4. The plasma processing device according to claim 2, wherein an isolation ring is arranged on a side, away from the bellows assembly, of the first flange, and an isolation ring is also arranged on a side, away from the bellows assembly, of the second flange.

5. The plasma processing device according to claim 4, further comprising fasteners, configured to fix the first flange, the second flange and/or the isolation rings.

6. The plasma processing device according to claim 4, wherein the isolation ring is made of a metal material.

7. The plasma processing device according to claim 4, wherein the isolation ring is made of an insulation material.

8. The plasma processing device according to claim 4, wherein at least one sealing ring is arranged between the isolation ring and the first flange, and at least one sealing ring is arranged between the isolation ring and the second flange.

9. The plasma processing device according to claim 1, wherein the bellows assembly is a stainless steel foil.

10. The plasma processing device according to claim 1, wherein the sleeve assembly is arranged on two sides of the bellows assembly, or a side, close to the radio-frequency circuit, of the bellows assembly.

11. The plasma processing device according to claim 1, wherein the first sleeve is arranged away from an outer side of the bellows assembly or close to an inner side of the bellows assembly, and correspondingly, the second sleeve is arranged close to the inner side of the bellows assembly or away from the outer side of the bellows assembly; and the first sleeve and the second sleeve are always maintained to be partially overlapped in a vertical direction.

12. The plasma processing device according to claim 11, wherein the first sleeve and/or the second sleeve is of an integral or separate structure.

13. The plasma processing device according to claim 12, wherein the first sleeve and the second sleeve are made of surface-treated metal materials.

14. The plasma processing device according to claim 12, wherein an insulating buffer layer is arranged between the first sleeve and the second sleeve, contacts the first sleeve and the second sleeve respectively, and ensures the first sleeve and the second sleeve not to contact.

15. The plasma processing device according to claim 14, wherein the insulating buffer layer is made of an insulation material.

16. The plasma processing device according to claim 14, wherein the second sleeve is provided with a clamping groove, configured to accommodate the insulating buffer layer.

17. The plasma processing device according to claim 14, wherein the insulating buffer layer is adhered to the first sleeve or the second sleeve.

18. The plasma processing device according to claim 1, wherein the lower electrode is fixed to an RF rod and located on an opening of a bottom wall of the process chamber, and a driving device fixed to a lower end of the RF rod drives the RF rod to move axially, so as to adjust a position of the lower electrode.

19. A retractable sealing part, arranged in or near a radio-frequency circuit of a plasma processing device, and comprising:
- a bellows assembly, having a first end and a second end; and
- a sleeve assembly, comprising a first sleeve and a second sleeve, wherein the first sleeve is arranged close to the first end of the bellows assembly, and the second sleeve is arranged close to the second end of the bellows assembly; free ends of the first sleeve and the second sleeve are overlapped with each other to form a radio-frequency shielding space when the first sleeve and the second sleeve slide relatively; the bellows assembly is located in the radio-frequency shielding space; and the sleeve assembly is a conductor; and
- an insulating buffer layer arranged between the first sleeve and the second sleeve, the insulating buffer layer contacts the first sleeve and the second sleeve, respectively.

* * * * *